(12) United States Patent
Tezuka

(10) Patent No.: US 9,113,507 B2
(45) Date of Patent: Aug. 18, 2015

(54) LIGHT SOURCE APPARATUS AND METHOD OF CONTROLLING THE SAME

(71) Applicant: CANON KABUSHIKI KAISHA, Tokyo (JP)

(72) Inventor: Taro Tezuka, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 212 days.

(21) Appl. No.: 13/942,248

(22) Filed: Jul. 15, 2013

(65) Prior Publication Data

US 2014/0021865 A1    Jan. 23, 2014

(30) Foreign Application Priority Data

Jul. 18, 2012 (JP) ................. 2012-159521

(51) Int. Cl.
*H05B 37/02* (2006.01)
*H05B 39/04* (2006.01)
*H05B 41/36* (2006.01)
*H01S 5/0687* (2006.01)
*H01S 5/12* (2006.01)
*H01S 5/00* (2006.01)
*H01S 5/40* (2006.01)

(52) U.S. Cl.
CPC .............. *H05B 37/02* (2013.01); *H01S 5/0687* (2013.01); *H01S 5/0085* (2013.01); *H01S 5/12* (2013.01); *H01S 5/4087* (2013.01)

(58) Field of Classification Search
USPC ................................... 315/149–159
See application file for complete search history.

(56) References Cited

U.S. PATENT DOCUMENTS

| | | | |
|---|---|---|---|
| 5,127,731 A * | 7/1992 | DeGroot | 356/486 |
| 2009/0189530 A1* | 7/2009 | Ashdown et al. | 315/152 |
| 2011/0309754 A1* | 12/2011 | Ashdown et al. | 315/151 |
| 2012/0235566 A1* | 9/2012 | Karalis et al. | 315/70 |

FOREIGN PATENT DOCUMENTS

| | | |
|---|---|---|
| JP | H04-082194 A | 3/1992 |
| JP | H06-050710 A | 2/1994 |
| JP | 2712965 B2 | 2/1998 |

* cited by examiner

*Primary Examiner* — Brandon S Cole
(74) *Attorney, Agent, or Firm* — Canon USA Inc IP Division

(57) ABSTRACT

A light source apparatus configured to emit first light and second light includes a wavelength reference device, a splitter, a first detector, a second detector, and a control unit. The control unit includes a correction unit configured to reduce from a detection signal detected by the first detector a portion included in the detected signal and related to an intensity of the second light incident on the first detector from the splitter, and configured to reduce from a detection signal detected by the second detector a portion included in the detected signal and related to an intensity of the first light incident on the second detector from the splitter. The control unit controls a wavelength of the first light and a wavelength of the second light based on signals from the correction unit.

9 Claims, 6 Drawing Sheets

LIGHT SOURCE APPARATUS AND METHOD OF CONTROLLING THE SAME

BACKGROUND OF THE INVENTION

1. Field of the Invention

The present disclosure relates to a light source apparatus for emitting beams of light of a plurality of wavelengths, and relates to a method of controlling a light source apparatus.

2. Description of the Related Art

Light source apparatuses for emitting light of a stabilized wavelength are developed for use in a light source of a length measuring device using interference, and in a light source for the frequency calibration (an optical frequency standard) of a semiconductor laser for optical communication. Generally, a light source apparatus having a stabilized wavelength includes a light source to be stabilized, a wavelength discriminator (a wavelength reference device) that converts a change in wavelength of the light source into a change in light intensity, and a detector that converts the light intensity into an electric signal. The light source apparatus further includes a calculator that obtains a wavelength error based on the electric signal from the detector, and a control unit that controls the light source based on the wavelength error.

As a light source apparatus for use in a light source of a length measuring device, an interferometer, and optical communication, a light source apparatus is known that stabilizes beams of light of a plurality of wavelengths and simultaneously outputs the beams of light. To stabilize beams of light of a plurality of wavelengths, as in a light source apparatus described in Japanese Patent No. 2712965, a method is known of stabilizing beams of light of a plurality of wavelengths with respect to each wavelength, and thereafter multiplexing the beams of light.

The light source apparatus of Japanese Patent No. 2712965 uses a Fabry-Perot cavity (an etalon) and a wavelength tunable laser as a wavelength discriminator. The light source apparatus multiplexes laser light from the wavelength tunable laser having a wavelength stabilized in advance to a first transmission peak of the etalon, with beams of light from light sources of a plurality of wavelengths, and detects a beat signal between the beam of light of a first wavelength among the plurality of wavelengths and the laser light from the wavelength tunable laser, thereby stabilizing the first wavelength of the light source apparatus based on the beat signal.

Next, the light source apparatus stabilizes the wavelength of the laser light from the wavelength tunable laser to a second transmission peak of the etalon, thereby similarly stabilizing a second wavelength of the light source apparatus. The light source apparatus performs this process on the beams of light of all the wavelengths, and thereby can stabilize the wavelengths of the light sources.

The light source apparatus of Japanese Patent No. 2712965, however, cannot simultaneously stabilize a plurality of different wavelengths. Consequently, an increase in the number of wavelengths of light sources to be stabilized increases the time during which each wavelength is not controlled. This reduces the accuracy of the stabilization.

In response, as in a light source apparatus described in Japanese Patent Publication No. 04-082194, a method is known of using a plurality of wavelength stabilizing apparatuses, the apparatuses including a wavelength discriminator and a calculator that are made common.

The light source apparatus of Japanese Patent Publication No. 04-082194 uses two light sources that emit linearly-polarized beams of light orthogonal to each other, coaxially multiplexes the beams of light from the respective light sources to guide the multiplexed beams of light to a wavelength discriminator (an etalon or a gas cell), and splits the beams of light by a polarizing beam splitter to detect the light intensity of each light source by a photodetector.

The light source apparatus of Japanese Patent Publication No. 04-082194, however, uses the polarizing beam splitter to separate the multiplexed beams of light of a plurality of wavelengths. Thus, even the use of a polarizing beam splitter having a high extinction ratio results in mixing the separated beam of light of one of the wavelengths with the separated beam of light of the other wavelength. Consequently, in one of the stabilization control systems, the other beam of light is mixed. This reduces the accuracy of the stabilization of wavelengths.

SUMMARY OF THE INVENTION

An embodiment of the present invention is directed to providing a light source apparatus for stabilizing beams of light of a plurality of wavelengths with high accuracy.

According to an aspect of the present invention, a light source apparatus configured to emit first light and second light includes a wavelength reference device that the first light and second light are incident on configured to change intensities of the respective beams of light according to a wavelength deviation of the respective beams of light from a first reference wavelength and a wavelength deviation of the respective beams of light from a second reference wavelength, a splitter configured to split light containing the first light and light containing the second light from the wavelength reference device from each other, a first detector configured to detect an intensity of the light containing the first light from the splitter, a second detector configured to detect an intensity of the light containing the second light from the splitter, and a control unit configured to control a wavelength of the first light using a detection signal detected by the first detector, such that the wavelength of the first light is the first reference wavelength, and configured to control a wavelength of the second light using a detection signal detected by the second detector, such that the wavelength of the second light is the second reference wavelength, wherein the control unit includes a correction unit configured to reduce from the detection signal detected by the first detector a portion included in the detected signal and related to the intensity of the second light incident on the first detector from the splitter, and configured to reduce from the signal detected by the second detector a portion included in the detected signal and related to the intensity of the first light incident on the second detector from the splitter, and wherein the control unit controls the wavelength of the first light and the wavelength of the second light based on signals from the correction unit.

Further features and aspects of the present invention will become apparent from the following detailed description of exemplary embodiments with reference to the attached drawings.

DESCRIPTION OF THE EMBODIMENTS

Figure 1:
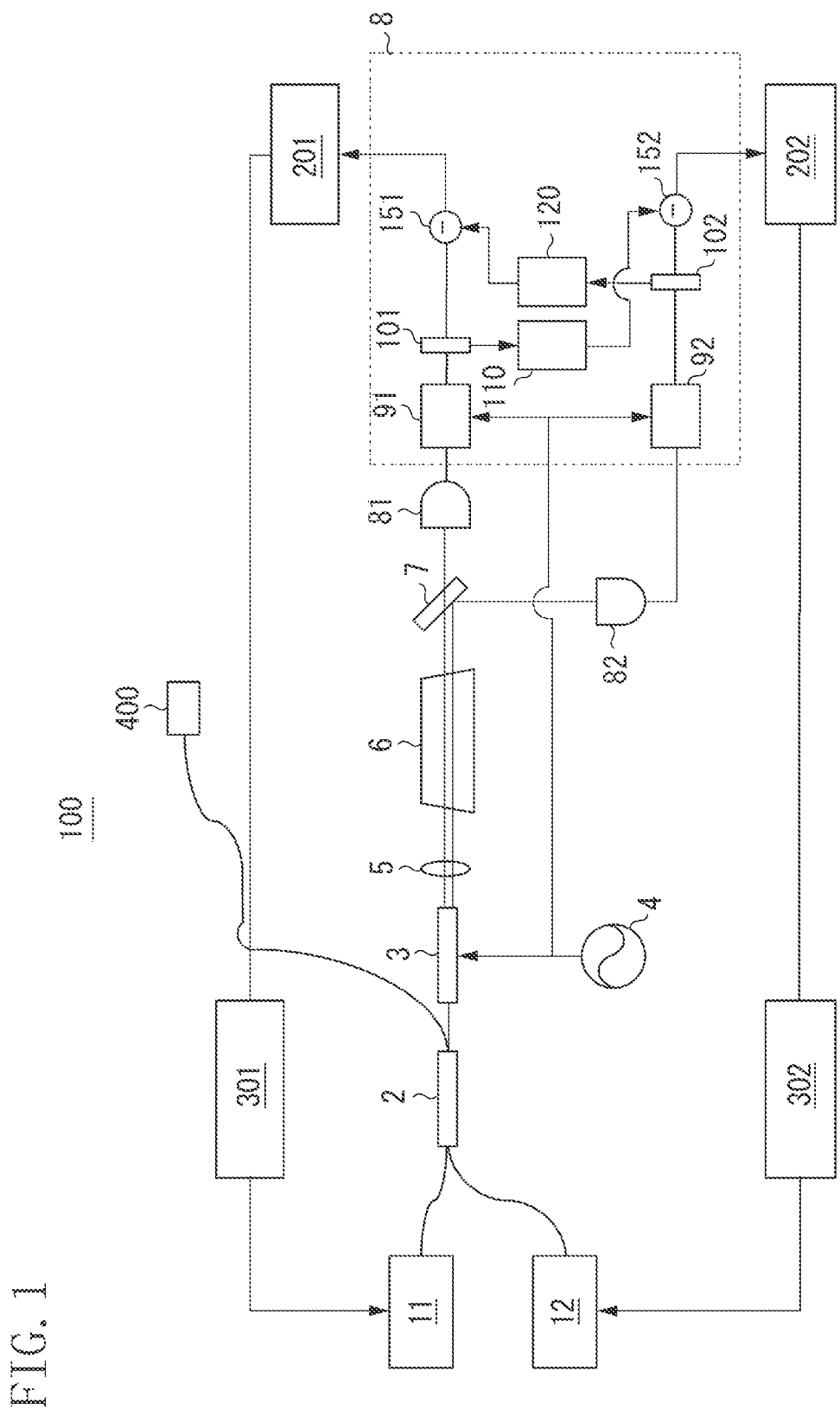
FIG. 1 is a diagram illustrating a light source apparatus according to a first exemplary embodiment of the present invention.

Exemplary embodiments of the present invention will be described in detail below based on the accompanying drawings. In the drawings, similar components are designated by the same numerals, and redundant description is omitted.

A first exemplary embodiment is described.

With reference to FIG. 1, a light source apparatus 100 according to the first exemplary embodiment is described. In FIG. 1, the light source apparatus 100 is an apparatus for stabilizing two beams of light different in frequency from each other. As illustrated in FIG. 1, the light source apparatus 100 according to the first exemplary embodiment includes light sources 11 and 12, a multiplexer 2, a modulator 3, a wavelength reference device 6, a splitter 7, detectors 81 and 82, and calculators 91 and 92. The light source apparatus 100 also includes distributors 101 and 102, attenuators 110 and 120, subtractors 151 and 152, and controllers 201 and 202 (control units).

The configuration of the light source apparatus 100 according to the first exemplary embodiment is described in detail. Each of the light sources 11 and 12 is a distributed feedback (DFB) laser diode that is mass-produced and inexpensively available and has a center wavelength in the 1.5 μm wavelength range. Alternatively, each of the light sources 11 and 12 may be an external cavity semiconductor laser or a fiber laser. The beams of light emitted from the light sources 11 and 12 are different in wavelength from each other have wavelengths $\lambda 1$ and $\lambda 2$, respectively. The wavelength $\lambda 1$ represents the peak wavelength of the spectrum of light emitted from the light source 11. Similarly, the wavelength $\lambda 2$ represents the peak wavelength of the spectrum of light emitted from the light source 12.

The multiplexer 2, which multiplexes (combines) the outputs of the light sources 11 and 12, is an optical fiber coupler having 2×2 branch ports and a branch ratio of 1 to 1. Alternatively, the multiplexer 2 may be a waveguide optical coupler. One of the output terminals of the multiplexer 2 is connected to an emission unit 400 of the light source apparatus 100, and the other is connected to the modulator 3.

The modulator 3 is a waveguide type lithium niobate modulator (LN modulator), which is a high-efficiency electro-optic modulator (EOM). The LN modulator is a device used in optical communication, and can achieve highly efficient frequency modulation (wavelength modulation) at low cost. Alternatively, the optical modulator 3 may be a bulk type EOM. The modulator 3 is connected to a modulation signal generator 4.

The modulation signal generator 4 is an electric circuit capable of generating a sine signal with an appropriate frequency and an appropriate amplitude. The modulation signal generator 4 drives the modulator 3 and outputs the same signal to both the calculators 91 and 92.

A collimator lens 5 changes the light emitted from the modulator 3 into a parallel light beam. The emitted light changed into the parallel light beam is incident on the wavelength reference device 6 (a wavelength discriminator).

Figure 2:
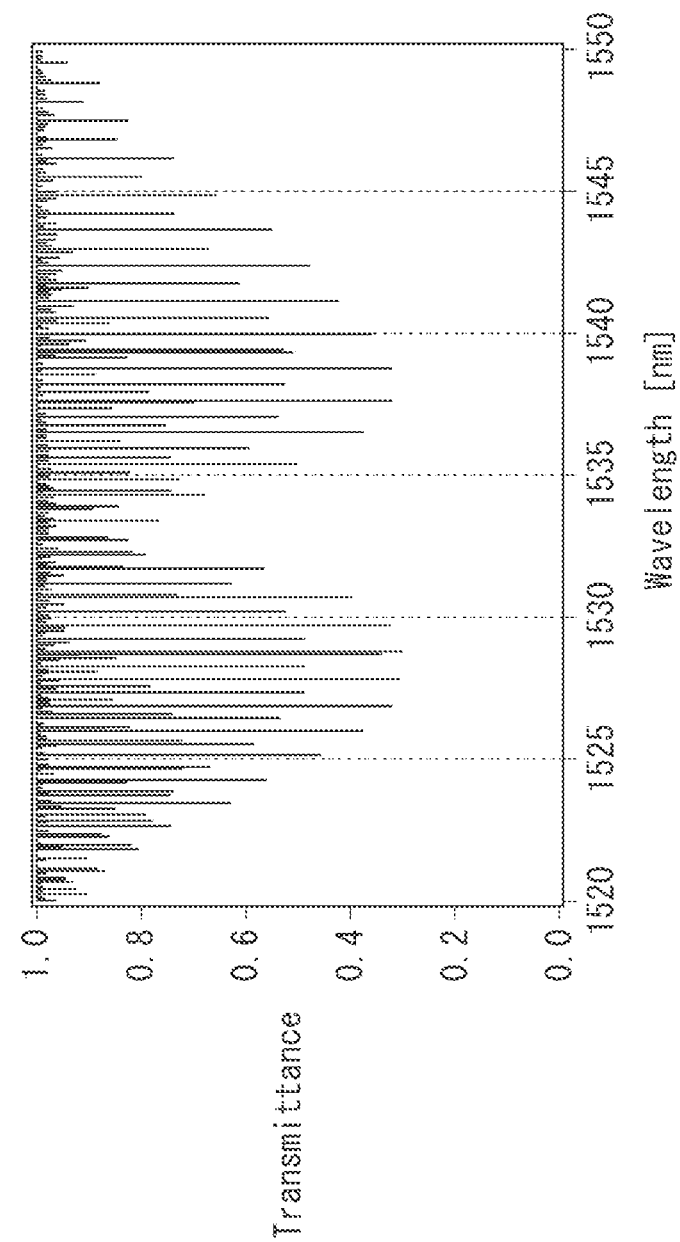
FIG. 2 is a diagram illustrating the spectrum of a wavelength reference device according to the first exemplary embodiment of the present invention.

The wavelength reference device 6 is a gas cell obtained by encapsulating acetylene gas in an optically transparent hermetic container. FIG. 2 illustrates the absorption spectrum of acetylene gas. Acetylene gas has a large number of strong absorption lines in the 1.5 μm wavelength range, and these absorption lines are widely used as reference wavelengths for stabilized light sources for optical communication. The gas encapsulated in the gas cell may be another gas such as hydrogen cyanide instead of acetylene gas. The wavelength reference device 6 may also be an etalon instead of the gas cell. Depending on the light source, a wavelength reference device having a reference wavelength for the wavelength to be stabilized may be used. Hereinafter, an absorption line used to stabilize the wavelength $\lambda 1$ (a first wavelength) of the light source 11 has a center wavelength $\lambda 1c$ (a first reference wavelength), and an absorption line used to stabilize the wavelength $\lambda 2$ (a second wavelength) of the light source 12 has a center wavelength $\lambda 2c$ (a second reference wavelength).

The splitter 7 is a band-pass filter (BPF) that selectively transmits the wavelength $\lambda 1$ of the light source 11. Alternatively, the splitter 7 may be an edge pass filter whose edge wavelength is $(\lambda 1+\lambda 2)/2$, a notch filter, or an arrayed waveguide grating type fiber coupler.

Each of the detectors 81 and 82 is an InGaAs photodiode (PD) for the 1.5 μm wavelength range. Alternatively, each of the detectors 81 and 82 may be a detector sensitive to the wavelengths of the light sources 11 and 12, such as an avalanche photodiode.

The calculator 91 (a first calculator) includes an electric circuit having a synchronous detector and a phase shifter. The calculator 91 outputs a voltage signal (an error signal) proportional to the difference between the wavelength $\lambda 1$ of the light source 11 and the center wavelength $\lambda 1c$ of the absorption line, based on a reference signal from the modulation signal generator 4 and a signal output from the detector 81 (a first detector). The calculator 92 (a second calculator) is similar in configuration and function to the calculator 91. The calculator 92 outputs a voltage signal (an error signal) proportional to the difference between the wavelength $\lambda 2$ of the light source 12 and the center wavelength $\lambda 2c$ of the absorption line, based on the reference signal from the modulation signal generator 4 and a signal output from the detector 82 (a second detector).

The generation of the error signals is specifically described. The calculator 91 includes a phase shift circuit, a mixing circuit, and a low-pass filter. First, the phase shift circuit matches the phase of the signal of the modulation signal generator 4 with the phase of the signal from the detector 81. Next, the mixing circuit outputs the product of the signal of the modulation signal generator 4 and the signal from the detector 81, the phases of the signals matched to each other. The filter (the low-pass filter) extracts the direct-current component of the signal output from the mixing circuit. The output of the filter serves as an error signal. If a significant delay does not occur in the transmission systems of the modulation signal generator 4 and the detector 81, the calculator 91 may not need to include the phase shift circuit. Also the calculator 92 can output an error signal by a similar method.

Each of the distributors 101 and 102 is a coaxial distributor. The distributor 101 branches the output of the calculator 91 into two paths, and the distributor 102 branches the output of the calculator 92 into two paths. A part of the signal branched by the distributor 101 is incident on the attenuator 110 (a first attenuator), and a part of the signal branched by the distributor 102 is incident on the attenuator 120 (a second attenuator).

Each of the attenuators 110 and 120 is a general operational amplifier, so that the attenuator 110 can attenuate the part of the signal output from the calculator 91 by an appropriate attenuation factor, and the attenuator 102 can attenuate the part of the signal output from the calculator 92 by an appropriate attenuation factor.

Each of the subtractors 151 and 152 is a differential amplifier. The subtractor 151 (a first subtractor) subtracts the signal attenuated by the attenuator 120 from the signal output from the calculator 91. Similarly, the subtractor 152 (a second subtractor) subtracts the signal attenuated by the attenuator 110 from the signal output from the calculator 92.

In the first exemplary embodiment, the calculators 91 and 92, the distributors 101 and 102, the attenuators 110 and 120, and the subtractors 151 and 152 are referred to collectively as a correction unit 8. The calculators 91 and 92, the distributors 101 and 102, the attenuators 110 and 120, and the subtractors 151 and 152 of the correction unit 8 may be mounted on the same substrate. In the first exemplary embodiment, each of the calculation functions is described as an independent element. Alternatively, a plurality of calculation functions may be mounted on the same element.

The signals having passed through the subtractors 151 and 152 are incident on the controllers 201 and 202, respectively. Each of the controllers 201 and 202 is a personal computer (PC) or a computing machine on which an integrated circuit such as a field programmable gate array (FPGA) is mounted. The controller 201 feeds back a control signal to a laser diode (LD) driver 301, and the controller 202 feeds back a control signal to an LD driver 302. Another configuration from the calculators 91 and 92 to the controllers 201 and 202 may be such that the signals from the detectors 81 and 82 are subjected to analog-to-digital (AD) conversion, and the calculators 91 and 92, the distributors 101 and 102, the attenuators 110 and 120, the subtractors 151 and 152, and the controllers 201 and 202 are mounted as a digital control system on a PC or an FPGA.

Each of the LD drivers 301 and 302 is an LD driver capable of optionally setting the driving current and the operating temperature of a DFB semiconductor laser. A DFB semiconductor laser can change its wavelength by changing its driving current or its operating temperature. In the first exemplary embodiment, each of the light sources 11 and 12 changes its wavelength by changing its driving current with its temperature controlled to be constant.

Stabilization of Wavelengths

Next, the operating principle of the stabilization of beams of light of a plurality of wavelengths in the first exemplary embodiment is described. At the start of the stabilization of the wavelengths, the temperatures of the light sources 11 and 12 have been adjusted to their operating temperatures by the LD drivers 301 and 302, respectively, and are turned on with initial driving currents. Based on the wavelength-temperature characteristics and the wavelength-current characteristics of the light sources 11 and 12 that have been measured in advance, the operating temperatures and the initial driving currents are set such that the emission wavelengths of the light sources 11 and 12 approximately coincide with the center wavelengths $\lambda 1c$ and $\lambda 2c$, respectively, of the absorption lines of acetylene gas.

The multiplexer 2 multiplexes the beam of light emitted from the light source 11 with the beam of light emitted from the light source 12, and the modulator 3 wavelength-modulates the multiplexed beams of light at a modulation frequency f of the modulation signal generator 4.

Figure 3A:
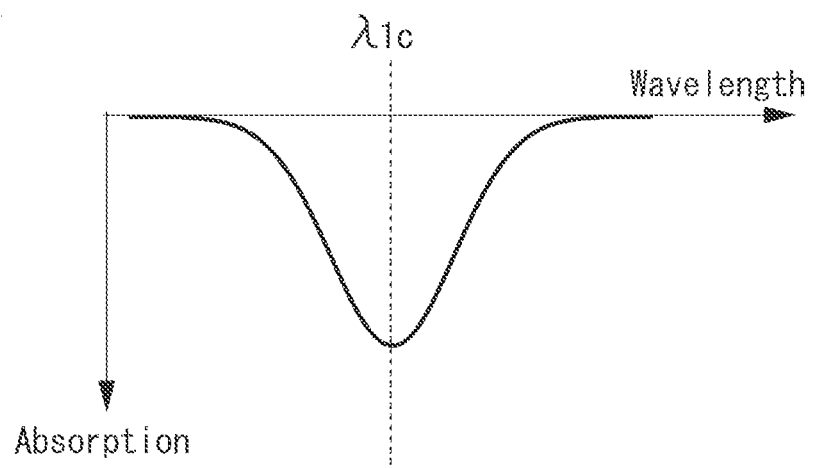
FIGS. 3A and 3B are diagrams illustrating the relationship between an absorption line and an error signal in the first exemplary embodiment of the present invention.

The absorption lines of the acetylene gas cell, which is the wavelength reference device 6, have an absorption spectrum schematically illustrated in FIG. 3A. The wavelength-modulated beams of light from the light sources 11 and 12 pass through the gas cell, whereby the intensities of the beams of light are changed (the beams of light are intensity-modulated). FIG. 3A is a diagram schematically illustrating, among the plurality of absorption lines of the acetylene gas cell, the absorption spectrum of the center wavelength $\lambda 1c$ used to control the beam of light of the wavelength $\lambda 1$ emitted from the light source 11.

First, the case is described where the wavelength of the beam of light (first light) emitted from the light source 11 is stabilized. The splitter 7 splits (separates) the beam of light emitted from the light source 11 and having passed through the gas cell, from the beam of light emitted from the light source 12, and the detector 81 detects the split beam of light emitted from the light source 11. The calculator 91 detects, synchronously at the modulation frequency f of the modulation signal generator 4, the signal detected by the detector 81, and converts the signal into an error signal proportional to the difference between the center wavelength $\lambda 1c$ of the absorption line and the wavelength $\lambda 1$ of the light source 11.

Figure 3B:
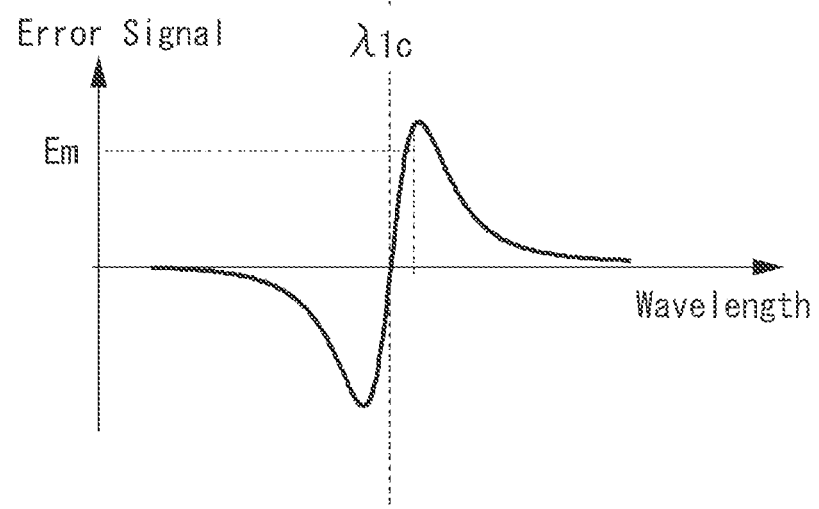

FIG. 3B is a schematic diagram illustrating the error signal in the first exemplary embodiment. The error signal has a profile corresponding to a first derivation of the absorption line illustrated in FIG. 3A. The controller 201 receives through the subtractor 151 the error signal output from the calculator 91. The controller 201 and the LD driver 301 perform feedback control on the driving current of the light source 11 to reduce the error signal to zero, thereby performing stabilization control on the wavelength of the first light emitted from the light source 11 such that the wavelength is the center wavelength $\lambda 1c$ of the absorption line.

Next, the case is described where the wavelength of the beam of light (second light) emitted from the light source 12 is stabilized. Similarly to the light source 11, the absorption lines of the acetylene gas cell have the absorption spectrum of the center wavelength $\lambda 2c$. The splitter 7 separates the second light emitted from the light source 12, from the beam of light emitted from the light source 11. Then, stabilization control is performed on the wavelength of the second light by a method similar to that of the light source 11, using the detector 82, the calculator 92, the subtractor 152, the controller 202, and the LD driver 302, such that the wavelength is the center wavelength $\lambda 2c$.

In the present exemplary embodiment, the wavelength reference device 6 is made common to two wavelengths to simplify the light source apparatus 100. Further, the simultaneous stabilization control of two wavelengths enables the stabilization of wavelengths more accurate than that of a conventional light source apparatus.

Mechanism of Stabilization

Figure 4A:
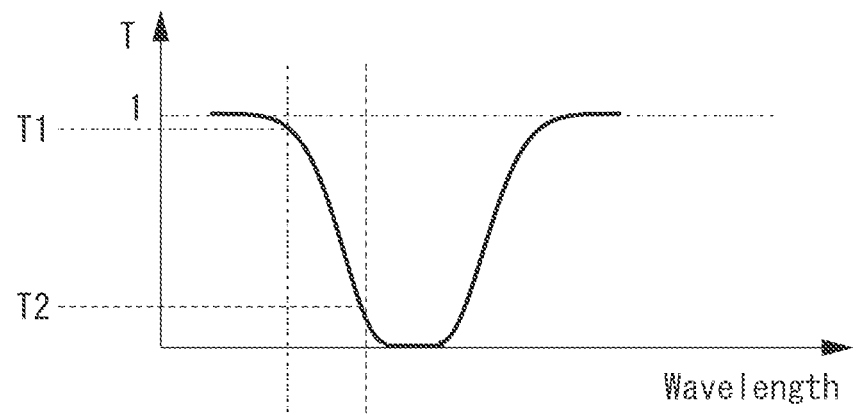
FIGS. 4A and 4B are diagrams illustrating the spectral characteristics of a splitter according to the first exemplary embodiment of the present invention.
Figure 4B:
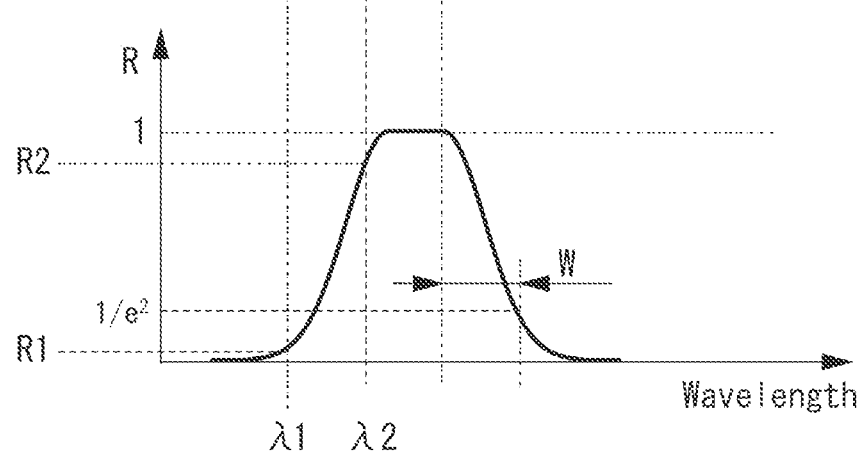

Next, the operations and the effects of the attenuators 110 and 120 and the subtractors 151 and 152 according to the first exemplary embodiment are described in detail. The splitter 7 separates the beams of light emitted from the light sources 11 and 12 and multiplexed by the multiplexer 2, into the beams of light of the wavelengths $\lambda 1$ and $\lambda 2$, respectively. FIGS. 4A and 4B illustrate the spectral characteristics of the splitter 7, which is a BPF. FIG. 4A illustrates the transmittance (T) of the splitter 7, and FIG. 4B illustrates the reflectance (R) of the splitter 7. Hereinafter, the splitter 7 has a transmittance T1 and a reflectance R1 at the wavelength $\lambda_1$, and has a transmittance T2 and a reflectance R2 at the wavelength $\lambda 2$.

In the first exemplary embodiment, the error signal is proportional to the amplitude of the modulation frequency f of the light and is attenuated in proportion to the intensity of the light. The light sources 11 and 12 share the modulator 3, and therefore use the same modulation frequency f. Thus, an error signal E91 detected by the calculator 91 through the detector 81 and an error signal E92 detected by the calculator 92 through the detector 82 are expressed by the following equations (1) and (2), respectively.

$$E91=E1\times T1+E2\times T2 \quad \text{equation (1)}$$

$$E92=E1\times R1+E2\times R2 \quad \text{equation (2)}$$

Where E1 is an error signal of the light source 11 before the splitter 7, and E2 is an error signal of the light source 12 before the splitter 7.

It is understood from the equation (1) that the error signal E91 includes the term of the error signal E2 of the light source 12 as well as the error signal E1 of the light source 11 to be controlled. Similarly, it is understood from the equation (2) that the error signal E92 includes the term of the error signal E1 of the light source 11 as well as the error signal E2 of the light source 12 to be controlled. Thus, if the light source 11 is controlled based on the error signal E91, the second term in the equation (1) impairs the accuracy of the stabilization. If the light source 12 is controlled based on the error signal E92, the first term in the equation (2) impairs the accuracy of the stabilization.

The width of the tail ("W" in FIGS. 4A and 4B) indicated by the spectral characteristics of the splitter 7 (the BPF) is about several nanometers even in the case of a narrow band BPF. Thus, particularly when the wavelength interval between the wavelengths λ1 and λ2 is 1 nm or less, the reflectance R1 and the transmittance T2 increase, and the ratio of the second term to the first term in each of the equations (1) and (2) increases. This greatly impairs the stability.

The distributor 101 distributes the output of the calculator 91 into two paths, thereby inputting one of the distributed results to the subtractor 151 and inputting the other to the subtractor 152 through the attenuator 110. Similarly, the distributor 102 distributes the output of the calculator 92 into two paths, thereby inputting one of the distributed results to the subtractor 152 and inputting the other to the subtractor 151 through the attenuator 120. The attenuator 110 attenuates a part of the error signal obtained by the calculator 91, and the attenuator 120 attenuates a part of the error signal obtained by the calculator 92. An attenuation factor C10 of the attenuator 110 and an attenuation factor C20 of the attenuator 120 are expressed by the following equations (3) and (4), respectively.

$$C10=R1/T1 \quad \text{equation (3)}$$

$$C20=T2/R2 \quad \text{equation (4)}$$

In the first exemplary embodiment, the transmittances T1 and T2 and the reflectances R1 and R2 are obtained from the measured values of the spectral characteristics of the splitter 7, thereby determining the attenuation factors C10 and C20 of the attenuators 110 and 120. It is possible to make the attenuation factors C10 and C20 of the attenuators 110 and 120 variable by changing the spectral characteristics of the splitter 7 to different characteristics. As another method of determining the attenuation factors C10 and C20, it is also possible to measure the output values of the detectors 81 and 82 by the following steps A1 to A4, using a light source apparatus for stabilizing beams of light of a plurality of wavelengths, thereby determining the attenuation factors C10 and C20 based on the measured results.

Step A1: measuring an output Id81 of the detector 81 and an output Id82 of the detector 82 with the light sources 11 and 12 turned off.

Step A2: measuring an output I181 of the detector 81 and an output I182 of the detector 82 with the light source 11 being start-up (actuated) and stabilization control performed (only the beam of light of the wavelength λ1 emitted).

Step A3: measuring an output I281 of the detector 81 and an output I282 of the detector 82 with the light source 11 turned off, the light source 12 being start-up (actuated), and stabilization control performed (only the beam of light of the wavelength λ2 emitted).

Step A4: obtaining the attenuation factors C10 and C20 from the measured results obtained in steps A1 to A3, based on the following equations (5) and (6), respectively.

$$C10=(I182-Id82)/(I181-Id81) \quad \text{equation (5)}$$

$$C20=(I281-Id81)/(I282-Id82) \quad \text{equation (6)}$$

As yet another method of determining the attenuation factors C10 and C20 of the attenuators 110 and 120, it is possible to determine the attenuation factors C10 and C20 by the following steps B1 to B5, using a light source apparatus for stabilizing beams of light of a plurality of wavelengths. Specifically, the method measures error signals input to the controllers 201 and 202, thereby determining the attenuation factors C10 and C20 based on the measured results.

Step B1: measuring an error signal E201d1 input to the controller 201 and an error signal E202d1 input to the controller 202, with only the light source 11 being start-up (actuated) and stabilization control performed such that an error signal target value Et=0.

Step B2: measuring an error signal E201h1 input to the controller 201 and an error signal E202h1 input to the controller 202, with stabilization control performed by changing the error signal target value Et of the light source 11 from 0 to Eh1. The error signal target value Eh1 is a value which is close to an error signal value Em corresponding to one end of the linear region in the error signal profile illustrated in FIG. 3B, and which can be subjected to stabilization control.

Step B3: measuring an error signal E201d2 input to the controller 201 and an error signal E202d2 input to the controller 202, with the light source 11 turned off, the light source 12 being start-up (actuated), and stabilization control performed such that the error signal target value Et=0.

Step B4: measuring an error signal E201h2 input to the controller 201 and an error signal E202h2 input to the controller 202, with stabilization control performed by changing the error signal target value Et of the light source 12 from 0 to Eh2. The error signal target value Eh2 is determined similarly to the error signal target value Eh1.

Step B5: obtaining the attenuation factors C10 and C20 from the measured results obtained in steps B1 to B4, based on the following equations (7) and (8), respectively.

$$C10=(E202h1-E202d1)/(E201h1-E201d1) \quad \text{equation (7)}$$

$$C20=(E201h2-E201d2)/(E202h2-E202d2) \quad \text{equation (8)}$$

If the attenuation factors C10 and C20 are obtained based on the equations (5) and (6) or the equations (7) and (8), an attenuation factor update unit configured to update the attenuation factors C10 and C20 from the control system to the attenuators 110 and 120 can be provided to periodically make the above measurements and update the attenuation factors C10 and C20. It is possible to obtain the spectral characteristics of the splitter 7 by causing a light source to emit light (by starting up a light source) with respect to each of the beams of light of a plurality of different wavelengths. The attenuation factors C10 and C20 of the attenuators 110 and 120 are thus set according to the spectral characteristics of the splitter 7.

The subtractor 151 outputs the difference between the error signal E91 and the error signal E92 attenuated by the attenuator 120, and the subtractor 152 outputs the difference between the error signal E92 and the error signal E91 attenuated by the attenuator 110. Thus, an error signal E201 input to the controller 201 of the light source 11 and an error signal E202 input to the controller 202 of the light source 12 can be expressed by the following equations (9) and (10), respectively.

$$E201 = E91 - E92 \times C20 \qquad \text{equation (9)}$$

$$E202 = E92 - E91 \times C10 \qquad \text{equation (10)}$$

Based on the equations (9) and (10) and the equations (1) to (4), the error signals E201 and E202 are expressed by the following equations (11) and (12), respectively.

$$E201 = (T1 - T2 \times R1/R2) \times E1 \qquad \text{equation (11)}$$

$$E202 = (R2 - R1 \times T2/T1) \times E2 \qquad \text{equation (12)}$$

As can be seen from the equation (11), in the error signal E201 after the correction of the attenuator 120 and the subtractor 151, an error signal E2×T2 of the beam of light of the other wavelength included in the error signal E91 before the correction is removed. Similarly, as can be seen from the formula (12), in the error signal E202 after the correction of the attenuator 110 and the subtractor 152, an error signal E1×R1 of the beam of light of the other wavelength included in the error signal E92 before the correction is removed. In the detected signal of the first light, a portion related to the intensity of the second light is reduced. That is, it is understood that the influence of the beam of light of the other wavelength mixed by the splitter 7 (the BPF) has been corrected. When the first light containing the first wavelength is controlled, the detected signal (the error signal) of the first light is corrected to reduce the detected signal of the wavelength other than the first wavelength. The light source 11 is controlled using the corrected error signal. Thus, detectors detect beams of light of a plurality of wavelengths different from each other, and the correction unit 8 corrects the detected signals. This enables the control of the light sources with high accuracy.

According to the first exemplary embodiment, it is possible to achieve a light source apparatus for stabilizing beams of light of two wavelengths with high accuracy with an inexpensive configuration using one wavelength reference device 6 (an etalon), without using a polarizing beam splitter having a high extinction ratio or a plurality of BPFs.

A second exemplary embodiment is described.

Figure 5:
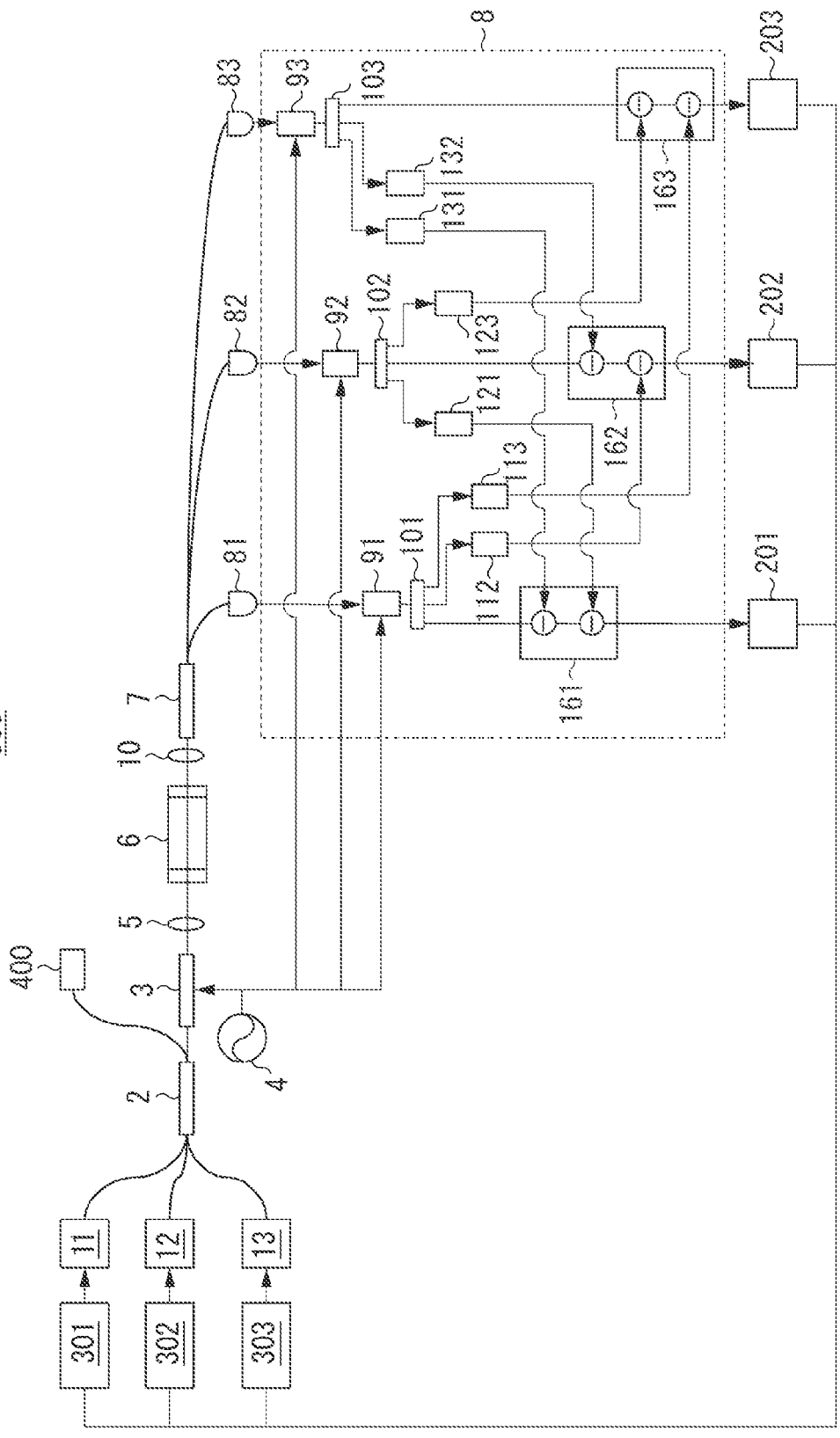
FIG. 5 is a diagram illustrating a light source apparatus according to a second exemplary embodiment of the present invention.

With reference to FIG. 5, a light source apparatus 500 according to the second exemplary embodiment is described. In FIG. 5, the light source apparatus 500 is an apparatus for stabilizing three beams of light different in frequency from one another. The apparatus configuration according to the second exemplary embodiment is basically similar to that according to the first exemplary embodiment. The configuration of the light source apparatus 500 is such that a third light source 13 of a wavelength λ3, a detector 83 that detects the beam of light emitted from the third light source 13, a calculator 93, a distributor 103, a controller 203 (a control unit), and an LD driver 303 are added to the light source apparatus 100 according to the first exemplary embodiment for stabilizing beams of light of two wavelengths. Further, the configuration of the light source apparatus 500 is such that the attenuators and the subtractors of the light source apparatus 100 are changed to correspond to three wavelengths.

The splitter 7 is an arrayed waveguide grating type optical fiber coupler. Each of the detectors 81, 82, and 83 is a fiber-coupling type photodiode (PD).

A collimator lens 10 is used to guide the light emitted from the wavelength reference device 6 to the optical fiber coupler. A basic method of stabilizing beams of light of different wavelengths according to the second exemplary embodiment is similar to the method according to the first exemplary embodiment, and therefore is not described here.

Next, the operations and the effects of attenuators 112, 113, 121, 123, 131, and 132 and subtractors 161, 162, and 163 according to the second exemplary embodiment are described.

Figure 6:
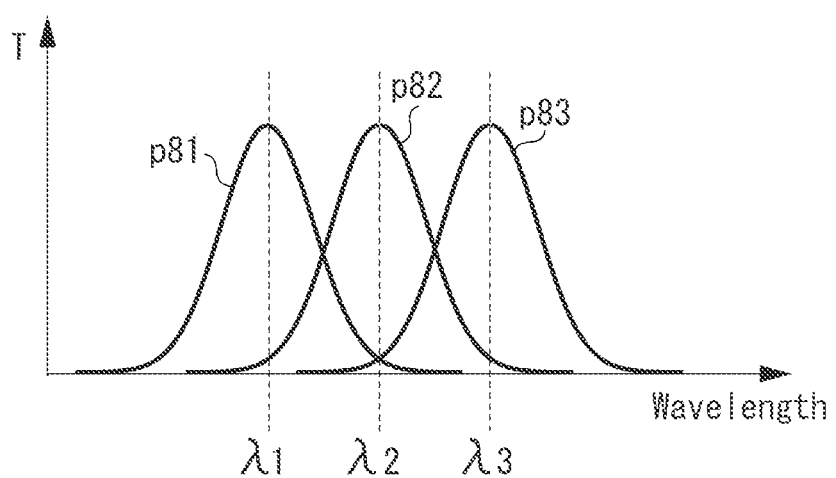
FIG. 6 is a diagram illustrating the spectral characteristics of a wavelength reference device according to the second exemplary embodiment of the present invention.

The splitter 7 separates the beams of light emitted from the light sources 11, 12, and 13 and multiplexed by the multiplexer 2, into the beams of light of the wavelengths λ1, λ2, and λ3, respectively. The splitter 7 is an optical fiber coupler having spectral characteristics in FIG. 6. FIG. 6 illustrates transmittances to output ports p81, p82, and p83 of the optical fiber coupler that are connected to the detectors 81, 82, and 83, respectively. Hereinafter, the transmittances of the wavelengths λ1, λ2, and λ3 to the output port p81 are transmittances T11, T12, and T13, respectively. The transmittances of the wavelengths λ1, λ2, and λ3 to the output port p82 are transmittances T21, T22, and T23, respectively. The transmittances of the wavelengths λ1, λ2, and λ3 to the output port p83 are transmittances T31, T32, and T33, respectively.

In the second exemplary embodiment, the calculators 91, 92, and 93, the distributors 101, 102, and 103, the attenuators 112, 113, 121, 123, 131, and 132, and the subtractors 161, 162, and 163 are referred to collectively as a correction unit 8. The calculators 91, 92, and 93, the distributors 101, 102, and 103, the attenuators 112, 113, 121, 123, 131, and 132, and the subtractors 161, 162, and 163 of the correction unit 8 may be mounted on the same substrate. In the second exemplary embodiment, each of the calculation functions is described as an independent element. Alternatively, a plurality of calculation functions may be mounted on the same element.

Similarly to the first exemplary embodiment, in the second exemplary embodiment, an error signal E91 output from the calculator 91, an error signal E92 output from the calculator 92, and an error signal E93 output from the calculator 93 are expressed by the following equations (13), (14), and (15), respectively.

$$E91 = E1 \times T11 + E2 \times T12 + E3 \times T13 \qquad \text{equation (13)}$$

$$E92 = E1 \times T21 + E2 \times T22 + E3 \times T23 \qquad \text{equation (14)}$$

$$E93 = E1 \times T31 + E2 \times T32 + E3 \times T33 \qquad \text{equation (15)}$$

Error signals E1, E2, and E3 are respectively error signals of the light sources 11, 12, and 13 before the respective beams of light are incident on the splitter 7 (the optical fiber coupler).

The distributor 101 branches the error signal E91 output from the calculator 91 into three paths, thereby inputting one of the distributed results to the subtractor 161 and inputting the other two to the subtractor 162 through the attenuator 112 and to the subtractor 163 through the attenuator 113. Similarly, the distributor 102 branches the error signal E92 output from the calculator 92 into three paths, thereby inputting one of the distributed results to the subtractor 162 and inputting the other two to the subtractor 161 through the attenuator 121 and to the subtractor 163 through the attenuator 123. Similarly, the distributor 103 branches the error signal E93 output from the calculator 93 into three paths, thereby inputting one of the distributed results to the subtractor 163 and inputting the other two to the subtractor 161 through the attenuator 131 and to the subtractor 162 through the attenuator 132.

The attenuators 112 and 113 attenuate parts of the error signal E91, the attenuators 121 and 123 attenuate parts of the error signal E92, and the attenuators 131 and 132 attenuate parts of the error signal E93. It is assumed that attenuation factors C12, C13, C21, C23, C31, and C32 of the attenuators 112, 113, 121, 123, 131, and 132 have been set to values of the following equations (16) to (21), respectively.

$$C12=(T21 \times T33-T23 \times T31)/(T11 \times T33-T13 \times T31) \quad \text{equation (16)}$$

$$C13=(T31 \times T22-T32 \times T21)/(T11 \times T22-T12 \times T21) \quad \text{equation (17)}$$

$$C21=(T12 \times T33-13 \times T32)/(T22 \times T33-T23 \times T32) \quad \text{equation (18)}$$

$$C23=(T32 \times T11-T31 \times T12)/(T11 \times T22-T12 \times T21) \quad \text{equation (19)}$$

$$C31=(T13 \times T22-T12 \times T23)/(T22 \times T33-T23 \times T32) \quad \text{equation (20)}$$

$$C32=(T23 \times T11-T21 \times T13)/(T11 \times T33-T13 \times T31) \quad \text{equation (21)}$$

In the second exemplary embodiment, the transmittances T11, T12, T13, T21, T22, T23, T31, T32, and T33 are respectively obtained from design values of the spectral characteristics of the splitter 7 (the optical fiber coupler). The attenuation factors C12, C13, C21, C23, C31, and C32 are set based on the obtained respective transmittances T11, T12, T13, T21, T22, T23, T31, T32, and T33.

The subtractor 161 outputs an error signal E201 obtained by subtracting from the error signal E91 the error signal E92 attenuated by the attenuator 121 and the error signal E93 attenuated by the attenuator 131. Similarly, the subtractor 162 outputs an error signal E202 obtained by subtracting from the error signal E92 the error signal E91 attenuated by the attenuator 112 and the error signal E93 attenuated by the attenuator 132. Similarly, the subtractor 163 outputs an error signal E203 obtained by subtracting from the error signal E93 the error signal E91 attenuated by the attenuator 113 and the error signal E92 attenuated by the attenuator 123.

Thus, the error signal E201 input to the controller 201, the error signal E202 input to the controller 202, and the error signal E203 input to the controller 203 can be expressed by the following equations (22), (23), and (24), respectively.

$$E201=E91-E92 \times C21-E93 \times C31 \quad \text{equation (22)}$$

$$E202=E92-E91 \times C12-E93 \times C32 \quad \text{equation (23)}$$

$$E203=E93-E91 \times C13-E92 \times C23 \quad \text{equation (24)}$$

Based on the above equations (13) to (24), the error signals E201, E202, and E203 can be expressed by the following formulas (25), (26), and (27), respectively.

$$E201=E1 \times C/(T22 \times T33-T23 \times T32) \quad \text{equation (25)}$$

$$E202=E2 \times C/(T11 \times T33-T13 \times T31) \quad \text{equation (26)}$$

$$E203=E3 \times C/(T11 \times T22-T12 \times T21) \quad \text{equation (27)}$$

Where a constant C is expressed by the following equation (28).

$$C=(T11 \times T22 \times T33-T11 \times T23 \times T32-T12 \times T21 \times T33+ T12 \times T23 \times T31+T13 \times T21 \times T32-T13 \times T22 \times T31) \quad \text{equation (28)}$$

As can be seen from the above equations (25) to (28), in the error signal E201 after the correction of the attenuators 121 and 131 and the subtractor 161 (the equation (25)), the terms of the error signals E2 and E3 included in the error signal E91 before the correction (the equation (13)) are removed. Similarly, in the error signal E202 after the correction of the attenuators 112 and 132 and the subtractor 162 (the equation (26)), the terms of the error signals E1 and E3 included in the error signal E92 before the correction (the equation (14)) are removed. Similarly, in the error signal E203 after the correction of the attenuators 113 and 123 and the subtractor 163 (the equation (27)), the terms of the error signals E1 and E2 included in the error signal E93 before the correction (the equation (15)) are removed. That is, it is understood that the influences of the beams of light of the other wavelengths mixed by the splitter 7 (the optical fiber coupler) have been corrected. Thus, according to the second exemplary embodiment, it is possible to achieve a light source apparatus for stabilizing beams of light of three wavelengths with high accuracy with a simple and inexpensive configuration, without forming a splitting system for three wavelengths using a plurality of interference filters.

To perform stabilization control on light sources of three or more wavelengths, the splitter 7 has characteristics corresponding to the number of wavelengths. Further, detectors are prepared depending on the number of wavelengths. Furthermore, calculators, distributors, attenuators, subtractors, and controllers are arranged in the correction unit 8 depending on the number of wavelengths. Thus, it is possible to simply perform stabilization control on beams of light of a plurality of wavelengths.

The above light source apparatus for emitting beams of light of a plurality of wavelengths can be used in a light source of a length measuring device, an interferometer, and a shape measuring device. The use of the above light source apparatus enables the stabilization of beams of light of a plurality of wavelengths. Thus, it is possible to improve the measurement accuracy of the length measuring device, the interferometer, and the shape measuring device. Further, it is possible to simultaneously stabilize beams of light of a plurality of wavelengths. This enables the simultaneous use of beams of light of a plurality of wavelengths.

While the exemplary embodiments of the present invention have been described, the present invention is not limited to these exemplary embodiments, but can be modified and changed in various manners within the scope of the invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2012-159521 filed Jul. 18, 2012, which is hereby incorporated by reference herein in its entirety.

What is claimed is:

1. A light source apparatus configured to emit first light and second light, the light source apparatus comprising:
a wavelength reference device that the first light and the second light are incident on configured to change intensities of the respective beams of light according to a wavelength deviation of the respective beams of light from a first reference wavelength and a wavelength deviation of the respective beams of light from a second reference wavelength;
a splitter configured to split light containing the first light and light containing the second light from the wavelength reference device from each other;
a first detector configured to detect an intensity of the light containing the first light from the splitter;
a second detector configured to detect an intensity of the light containing the second light from the splitter; and
a control unit configured to control a wavelength of the first light using a detection signal detected by the first detector, such that the wavelength of the first light is the first reference wavelength, and configured to control a wavelength of the second light using a detection signal detected by the second detector, such that the wavelength of the second light is the second reference wavelength, wherein the control unit includes a correction unit configured to reduce from the detection signal detected by the first detector a portion included in the detected signal and related to the intensity of the second light incident on the first detector from the splitter, and configured to reduce from the detection signal detected by the second detector a portion included in the detected signal and related to the intensity of the first light incident on the second detector from the splitter, and wherein the control unit controls the wavelength of the first light and the wavelength of the second light based on signals from the correction unit.

2. The light source apparatus according to claim 1, wherein the correction unit comprises:

a first calculator configured to obtain an error signal of the first light from the detection signal detected by the first detector;

a second calculator configured to obtain an error signal of the second light from the detection signal detected by the second detector;

a first attenuator configured to attenuate a part of the error signal of the first light obtained by the first calculator;

a second attenuator configured to attenuate a part of the error signal of the second light obtained by the second calculator;

a first subtractor configured to subtract the error signal of the second light attenuated by the second attenuator from the error signal of the first light obtained by the first calculator; and a second subtractor configured to subtract the error signal of the first light attenuated by the first attenuator from the error signal of the second light obtained by the second calculator, and wherein the control unit controls the wavelength of the first light and the second light using the error signal subtracted by the first subtractor and the second subtractor.

3. The light source apparatus according to claim 2, wherein the error signal of the first light is a signal representing a difference between the first reference wavelength and the wavelength of the first light, and wherein the error signal of the second light is a signal representing a difference between the second reference wavelength and the wavelength of the second light.

4. The light source apparatus according to claim 2, wherein an attenuation factor by which the first attenuator attenuates the part of the error signal of the first light and an attenuation factor by which the second attenuator attenuates the part of the error signal of the second light are obtained from a spectral characteristic of the splitter.

5. The light source apparatus according to claim 4, wherein the spectral characteristic of the splitter is at least one of a transmittance and a reflectance of the splitter at each of the wavelength of the first light and the wavelength of the second light.

6. The light source apparatus according to claim 2, wherein at least one of an attenuation factor by which the first attenuator attenuates the part of the error signal of the first light and an attenuation factor by which the second attenuator attenuates the part of the error signal of the second light is variable.

7. The light source apparatus according to claim 2, wherein an attenuation factor by which the first attenuator attenuates the part of the error signal of the first light and an attenuation factor by which the second attenuator attenuates the part of the error signal of the second light are obtained from a spectral characteristic of the splitter obtained based on detection signals detected by the first detector and the second detector when the first light and the second light have respectively been emitted.

8. The light source apparatus according to claim 1, further comprising a multiplexer configured to combine the first light and the second light different in wavelength from each other, wherein with respect to the first light and the second light combined by the multiplexer, the wavelength reference device changes, according to the wavelength deviation of the respective beams of light from the first reference wavelength and the wavelength deviation of the respective beams of light from the second reference wavelength, intensity of the respective beams of light.

9. A method of controlling a light source apparatus configured to emit first light and second light, the method comprising:

upon incidence of the first light and the second light, changing intensities of the respective beams of light according to a wavelength deviation of the respective beams of light from a first reference wavelength and a wavelength deviation of the respective beams of light from a second reference wavelength, splitting the first light and second light from each other into light containing the first light and light containing the second light;

detecting an intensity of the split light containing the first light and an intensity of the split light containing the second light; and controlling a wavelength of the first light using a detection signal detected in the detecting, such that the wavelength of the first light is the first reference wavelength, and controlling a wavelength of the second light using a detection signal detected in the detecting, such that the wavelength of the second light is the second reference wavelength, wherein in the controlling, performing correction to reduce a portion which is included in the detection signal of the first light detected in the detecting and which is related to the intensity of the second light, and to reduce a portion which is included in the detection signal of the second light detected in the detecting and which is related to the intensity of the first light, and controlling the wavelength of the first light and the wavelength of the second light based on signals in the performing correction.

* * * * *